United States Patent
Basker et al.

(10) Patent No.: US 10,886,363 B2
(45) Date of Patent: Jan. 5, 2021

(54) METAL-INSULATOR-METAL CAPACITOR STRUCTURE

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodoras E. Standaert, Clifton Park, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/441,076

(22) Filed: Jun. 14, 2019

(65) Prior Publication Data
US 2019/0312100 A1 Oct. 10, 2019

Related U.S. Application Data

(60) Continuation of application No. 15/206,688, filed on Sep. 9, 2016, now Pat. No. 10,388,718, which is a (Continued)

(51) Int. Cl.
*H01L 27/108* (2006.01)
*H01L 27/08* (2006.01)
(Continued)

(52) U.S. Cl.
CPC ........ *H01L 28/60* (2013.01); *H01L 27/11582* (2013.01); *H01L 28/00* (2013.01);
(Continued)

(58) Field of Classification Search
CPC .............................. H01L 28/60; H01L 28/90
See application file for complete search history.

(56) References Cited

U.S. PATENT DOCUMENTS 6,787,836 B2   9/2004   Clevenger et al.
7,859,081 B2   12/2010  Doyle et al.
(Continued)

FOREIGN PATENT DOCUMENTS

CN   101989837 A   3/2011

OTHER PUBLICATIONS

Office Action received in U.S. Appl. No. 15/260,682 dated Nov. 6, 2019, 18 pages.
(Continued)

*Primary Examiner* — Omar F Mojaddedi
(74) *Attorney, Agent, or Firm* — Steven Meyers; Andrew M. Calderon; Roberts Calderon Safran & Cole, P.C.

(57) ABSTRACT

The disclosure is directed to semiconductor structures and, more particularly, to Metal-Insulator-Metal (MIM) capacitor structures and methods of manufacture. The method includes: forming at least one gate structure; removing material from the at least one gate structure to form a trench; depositing capacitor material within the trench and at an edge or outside of the trench; and forming a first contact in contact with a first conductive material of the capacitor material and a second contact in contact with a second conductive material of the capacitor material.

12 Claims, 7 Drawing Sheets

Related U.S. Application Data division of application No. 14/861,511, filed on Sep. 22, 2015, now Pat. No. 10,312,318.

(51) Int. Cl.

| | | |
|---|---|---|
| *H01L 29/94* | (2006.01) | |
| *H01L 49/02* | (2006.01) | |
| *H01L 27/11582* | (2017.01) | |

(52) U.S. Cl.
CPC .............. *H01L 28/87* (2013.01); *H01L 28/88* (2013.01); *H01L 28/91* (2013.01); *H01L 28/92* (2013.01)

(56) References Cited

U.S. PATENT DOCUMENTS

| | | | |
|---|---|---|---|
| 8,017,997 | B2 | 9/2011 | Divakaruni et al. |
| 8,138,042 | B2 | 3/2012 | Doyle et al. |
| 8,148,772 | B2 | 4/2012 | Doyle et al. |
| 8,841,185 | B2 | 9/2014 | Khakifirooz et al. |
| 8,860,107 | B2 | 10/2014 | Haensch et al. |
| 10,312,318 | B2 | 6/2019 | Basker et al. |
| 2004/0036051 | A1* | 2/2004 | Sneh ................. H01L 27/10861 251/301 |
| 2008/0173978 | A1* | 7/2008 | Tu ........................... H01G 4/002 257/532 |
| 2010/0013047 | A1 | 1/2010 | Thies et al. |
| 2011/0031585 | A1 | 2/2011 | Xia et al. |
| 2011/0073994 | A1* | 3/2011 | Liu ..................... C23C 18/1216 257/532 |
| 2011/0210384 | A1 | 9/2011 | Xia et al. |
| 2012/0104551 | A1* | 5/2012 | Kemerer ................ H01L 28/91 257/534 |
| 2013/0020677 | A1* | 1/2013 | Su ....................... H01L 27/0805 257/532 |
| 2013/0056850 | A1 | 3/2013 | Kume et al. |
| 2013/0146959 | A1 | 6/2013 | Cheng et al. |
| 2013/0181326 | A1 | 6/2013 | Cheng et al. |
| 2013/0178021 | A1* | 7/2013 | Cheng ................. H01L 27/0629 438/155 |
| 2014/0124845 | A1 | 5/2014 | Cheng et al. |
| 2014/0319591 | A1* | 10/2014 | Toda ....................... H01L 28/60 257/296 |
| 2014/0357033 | A1 | 12/2014 | Mayuzumi et al. |
| 2015/0108557 | A1 | 4/2015 | Ponoth et al. |
| 2015/0228711 | A1 | 8/2015 | Tu |
| 2017/0084683 | A1 | 3/2017 | Basker et al. |
| 2017/0084684 | A1 | 3/2017 | Basker et al. |

OTHER PUBLICATIONS

List of IBM Patents or Patent Applications Treated as Related, dated Jul. 25, 2019, 1 page.
Specification "Metal-Insulator-Metal Capacitor Structure" and Drawings in related U.S. Appl. No. 16/506,292, filed Jul. 9, 2019, 27 pages.
"List of IBM Patents or Patent Applications Treated as Related", dated Jun. 13, 2019, 1 page.
Specification "Gate-All-Around FIN Device" and drawings in related U.S. Appl. No. 16/389,516, filed Apr. 19, 2019, 28 pages.
Office Action in U.S. Appl. No. 16/389,516 dated Mar. 5, 2020, 19 pages.
Notice of Allowance in U.S. Appl. No. 15/260,682 dated May 1, 2020, 31 pages.
Notice of Allowance in U.S. Appl. No. 16/506,292 dated Mar. 10, 2020, 12 pages.
Notice of Allowance in U.S. Appl. No. 16/389,516 dated Aug. 19, 2020, 31 pages.

* cited by examiner

METAL-INSULATOR-METAL CAPACITOR STRUCTURE

BACKGROUND

The invention relates to semiconductor structures and, more particularly, to Metal-Insulator-Metal (MIM) capacitor structures and methods of manufacture.

Metal-insulator-metal (MIM) capacitors have been used extensively in the fabrication of integrated analog and mixed signal circuits on semiconductor dies. A MIM capacitor typically includes a MIM capacitor dielectric situated between lower and upper metal plates, which form the electrodes of the MIM capacitor. MIM capacitors are fabricated on semiconductor dies during back-end-of-line (BEOL) processing. For example, a conventional MIM capacitor can be fabricated, for example, by inserting a dielectric layer for a MIM capacitor dielectric and metal layers for lower and upper MIM capacitor electrodes in an unused "vertical" space available between interconnect metal layers on a semiconductor die during BEOL processing.

SUMMARY

In an aspect of the invention, a method includes: forming at least one gate structure; removing material from the at least one gate structure to form a trench; depositing capacitor material within the trench and at an edge or outside of the trench; and forming a first contact in contact with a first conductive material of the capacitor material and a second contact in contact with a second conductive material of the capacitor material.

In an aspect of the invention, a method includes: forming a first gate structure having a first width dimension; forming a second gate structure having a second width dimension, larger than the first width dimension; removing material from the second gate structure to form a trench; and forming a capacitor structure within the trench and partly outside of the trench.

In an aspect of the invention, a structure includes: a first gate structure having a first width dimension; a second gate structure having a second width dimension, larger than the first width dimension; and a capacitor structure having a portion formed within a trench formed by removal of gate material of a second gate structure and partly outside of the trench.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to Metal-Insulator-Metal (MIM) capacitor structures and methods of manufacture. More specifically, the present invention is directed to trench MIM capacitor structures inside a wide gate structure. Advantageously, the MIM capacitor structures have improved capacitor contacts by recessing insulator material outside of the wide gate structure. Also, in embodiments, the capacitor area can be increased by including fins inside the wide gate structure. In the latter configuration, the fin pitch is dimensioned so that pinch-off of the MIM stack does not result.

The MIM capacitor structures of the present invention can be manufactured in a number of ways using a number of different tools. In general, though, the methodologies and tools are used to form structures with dimensions in the micrometer and nanometer scale. The methodologies, i.e., technologies, employed to manufacture the MIM capacitor structures of the present invention have been adopted from integrated circuit (IC) technology. For example, the structures of the present invention are built on wafers and are realized in films of material patterned by photolithographic processes on the top of a wafer. In particular, the fabrication of the MIM capacitor structures of the present invention uses three basic building blocks: (i) deposition of thin films of material on a substrate, (ii) applying a patterned mask on top of the films by photolithographic imaging, and (iii) etching the films selectively to the mask.

Figure 1:
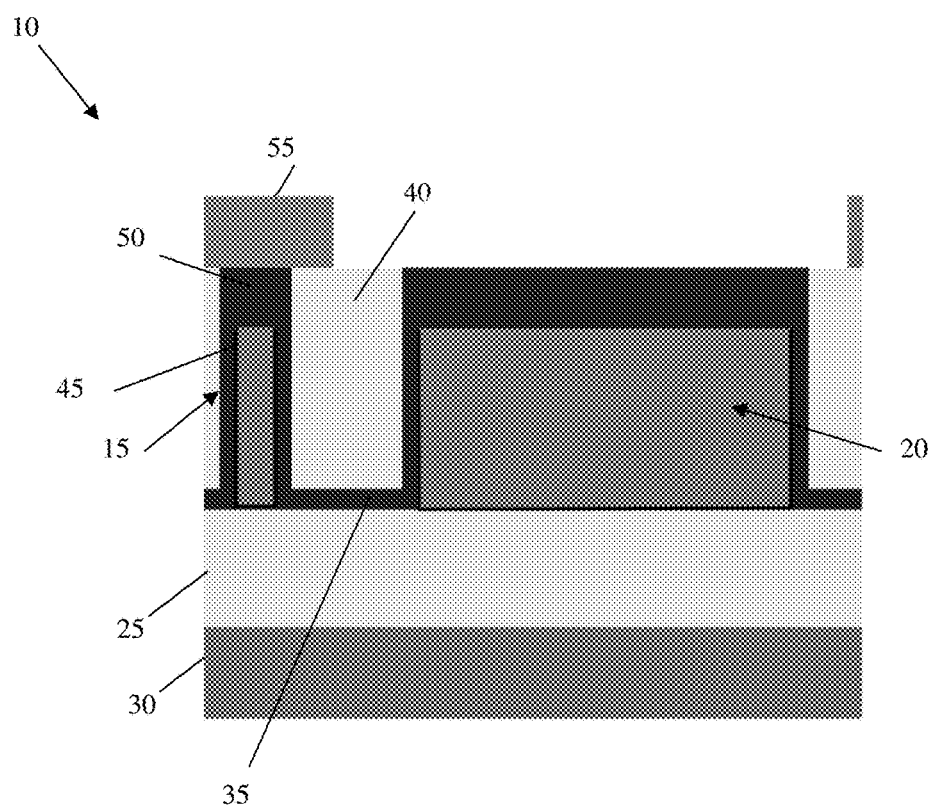
FIGS. 1-6 show structures and respective fabrication processes in accordance with aspects of the invention.

FIG. 1 shows a structure and respective fabrication processes in accordance with aspects of the invention. The structure 10 includes a first gate structure 15 and a second gate structure 20, with the second gate structure 20 is wider than the first gate structure 15. The gate structures 15, 20 can be formed on an insulator layer 25 using conventional replacement metal gate processes. The insulator layer 25 can be an oxide layer formed on a substrate 30. The substrate 30 may be composed of any suitable semiconductor material including, but not limited to, Si, SiGe, SiGeC, SiC, GE alloys, GaAs, InAs, InP, and other III/V or II/VI compound semiconductors. In embodiments, the substrate can be silicon-on-insulator (SOI) technology.

In embodiments, the conventional replacement metal gate processes comprise, for example, depositing and patterning poly material on the insulator layer 25. A nitride or low-k dielectric material 35 can be formed over the patterned poly material, and any exposed portions of the insulator layer 25. In embodiments, the nitride or low-k dielectric material 35 will encapsulate the gate structures 15, 20, and will form spacers or sidewalls on the gate structures 15, 20. An oxide or other insulator material 40 (e.g., interlevel dielectric material) can be deposited on the nitride or low-k dielectric material 35 using conventional deposition processes, e.g., chemical vapor deposition (CVD) processes, flowable oxide and high density plasma (HDP oxide and combinations thereof. The oxide or other insulator material 40 can be planarized to expose the poly material. The poly material is then removed and a high-k dielectric material, e.g., hafnium oxide, and gate stack material (e.g., metals with workfunction matching the desired transistor characteristics) is deposited within the trenches formed by the removal of the poly material. The high-k dielectric material and gate stack material is represented by reference numeral 45. The high-k dielectric material and gate stack material 45 are then recessed using conventional etching processes (e.g., reactive ion etching (RIE)). A capping material 50 (e.g., nitride) is then deposited within the recess to form the gate structures 15, 20 of FIG. 1.

Still referring to FIG. 1, a capacitor mask 55 is formed over the gate structure 15. In embodiments, the capacitor mask 55 can extend slightly beyond an edge of the gate structure 15, onto the oxide or other insulator material 40. In embodiments, the capacitor mask 55 can be a resist or hardmask, which is patterned through conventional lithographic processes, e.g., exposure to energy (light).

Figure 2:
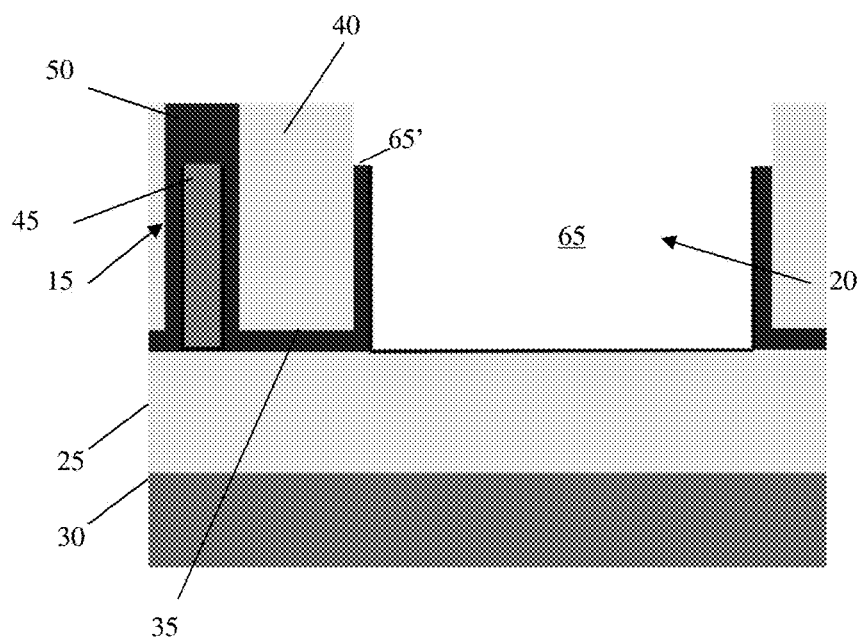

In FIG. 2, selective etching processes are performed to remove materials from the gate structure 20 in order to provide a trench 65. In particular, the capping material 50 and gate stack material are removed to form the trench 65. In embodiments, the capping material 50 and materials of the gate stack 15 are protected during this selective etching process by the capacitor mask. In embodiments, portions of the nitride material 35 are also recessed within the trench 65, as shown by reference numeral 65'. The selective etching processes will stop on the high-k dielectric material 45 of the gate structure 20. Once the etching processes are completed, the capacitor mask can be removed by conventional stripping processes, e.g., ashing processes.

Figure 3:
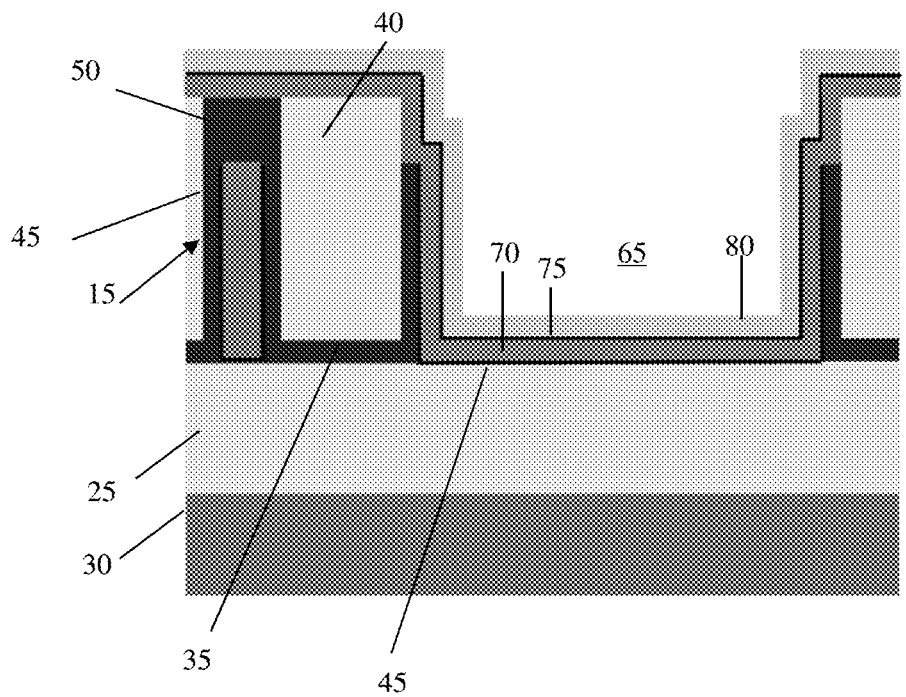

In FIG. 3, a bottom electrode material 70 (e.g., conductive electrode plate) is deposited on the high-k dielectric material 45, and any additional exposed surfaces of the structure. The bottom electrode material 70 can be tungsten silicide or TiN, for example, deposited to a thickness of about 5-10 nm; although other materials and dimensions are contemplated by the present invention. For example, the bottom electrode material 70 can be polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

A high-k dielectric material 75 can be deposited on the bottom electrode material 70, using an atomic layer deposition (ALD) process. The high-k dielectric material 75 can be deposited to a thickness of about a few nanometers; although other thicknesses are also contemplated by the present invention. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In alternate embodiments, the material 75 can be silicon oxide, silicon nitride, silicon oxynitride, boron nitride, high-k materials, or any combination of these materials.

A top electrode material 80 (e.g., conductive electrode plate) is deposited on the high-k dielectric material 75. The top electrode material 80 can be tungsten silicide or TiN, for example; although the use of other materials are contemplated by the present invention as already described herein. In embodiments, the top electrode material 80 can be the same or different material as the bottom electrode material 70.

Figure 4:
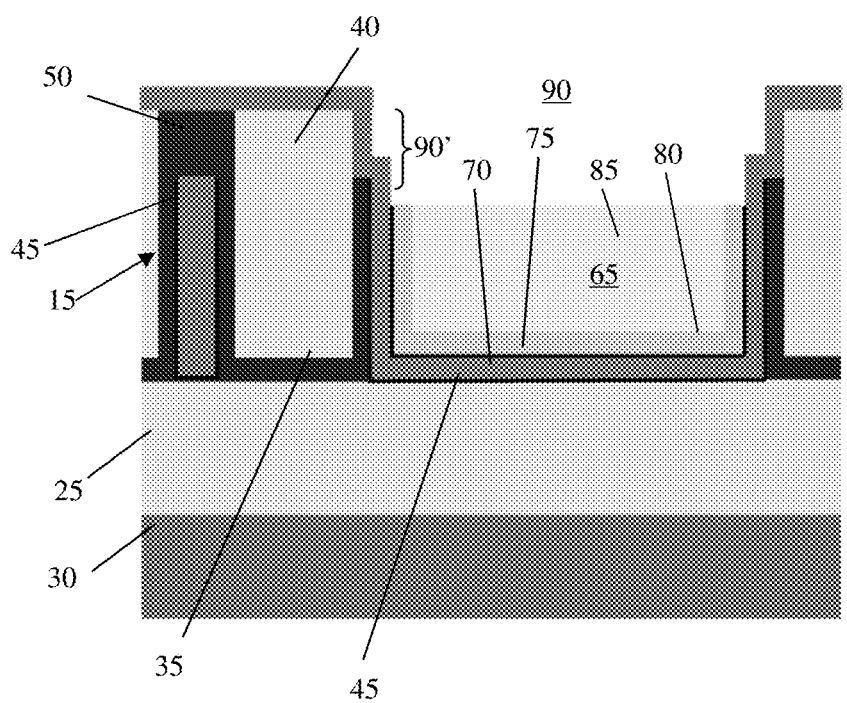

In FIG. 4, an organic planarization layer 85 can be deposited on the top electrode material 80, within the trench 65. After formation of the organic planarization layer 85, an additional etching process is performed to remove portions of the high-k dielectric material 75 and the top electrode material 80, leaving a stepped feature 90' within a recessed portion 90. In this way, the etching process will expose the top electrode material 80, for later contact.

Figure 5:
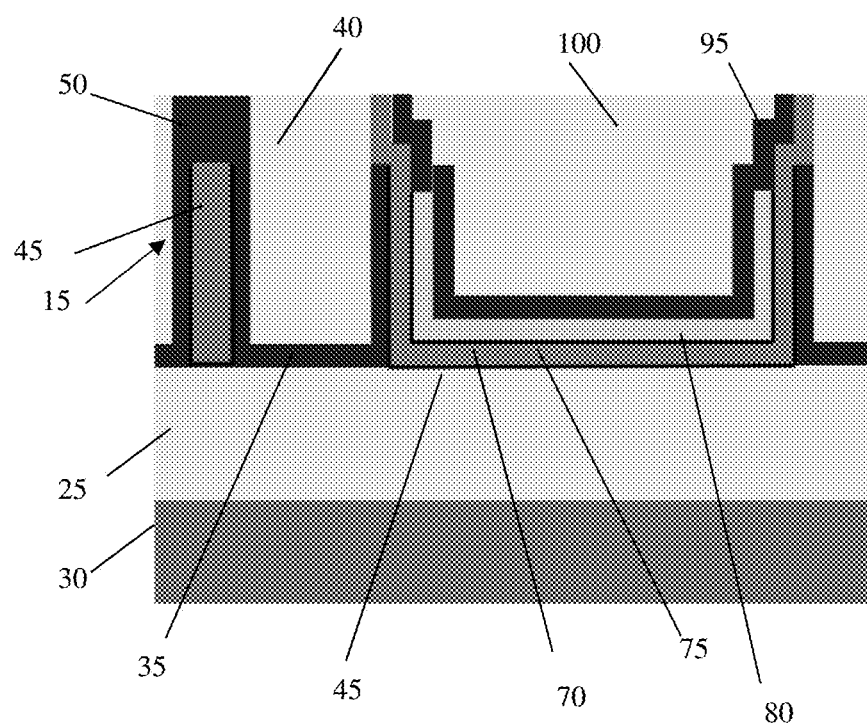

As further shown in FIG. 5, the organic planarization layer 85 can be removed through a selective etching process, following by a deposition of a cap material 95. In embodiments, the cap material 95 can be a nitride material or a low-k dielectric material, deposited using conventional CVD or plasma enhanced atomic layer deposition (PEALD) processes to a same or similar thickness as the nitride or low-k dielectric material 35. An insulator material 100 is then deposited on the cap material 95. The insulator material 100 can be an oxide material deposited using a conventional oxide fill process, e.g., CVD, HDP, flowable oxide and combinations thereof followed by a planarization process.

Figure 6:
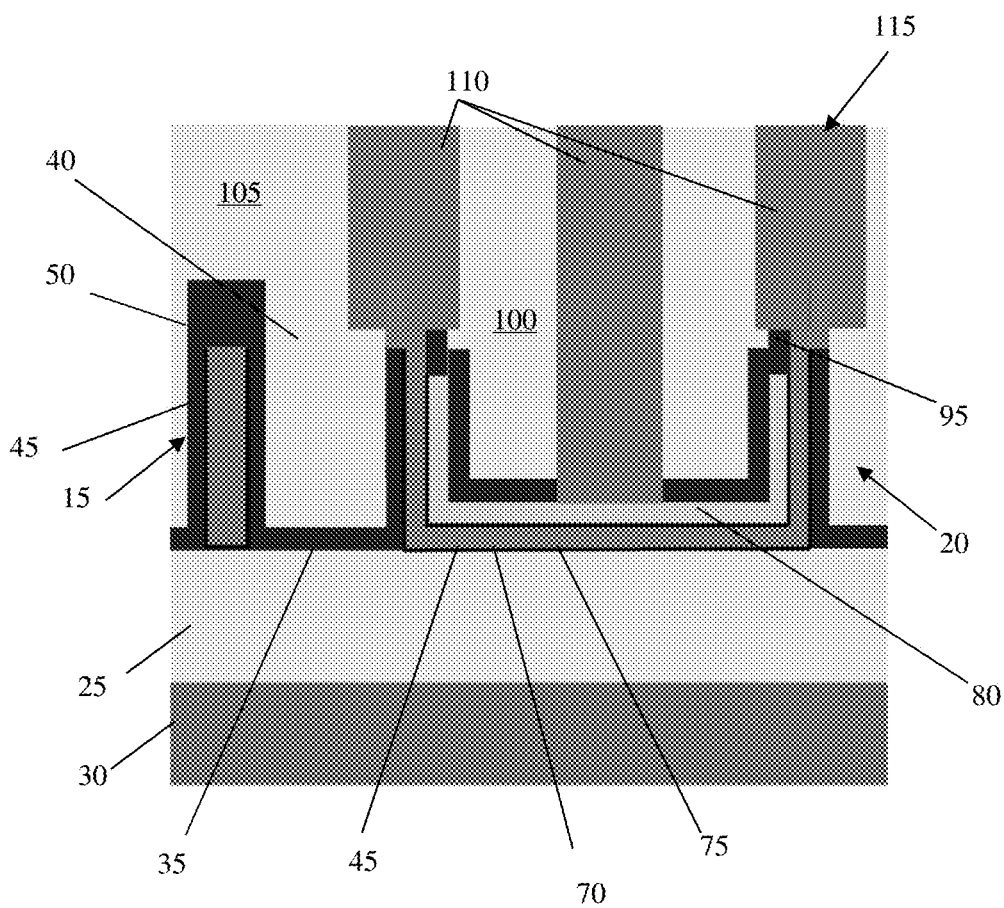

In FIG. 6, an interlevel dielectric material 105 is deposited on the insulator material 100. Contact trenches 110 are formed in the insulator material 100, 105 and through other materials to land on and expose a surface of the top electrode material 80 and the bottom electrode 70, respectively. In embodiments, the bottom electrode material 70 is contacted at an edge or outside of the gate structure 20, with the top electrode material 80 contacted in a center of the gate structure 20. The trenches are then filled with metal material, e.g., TiN liner with a tungsten fill, etc., followed by a planarization process (e.g., chemical mechanical polishing (CMP)) to form contacts 115 in direct electrical contact with the electrode materials 70, 80.

Figure 7:
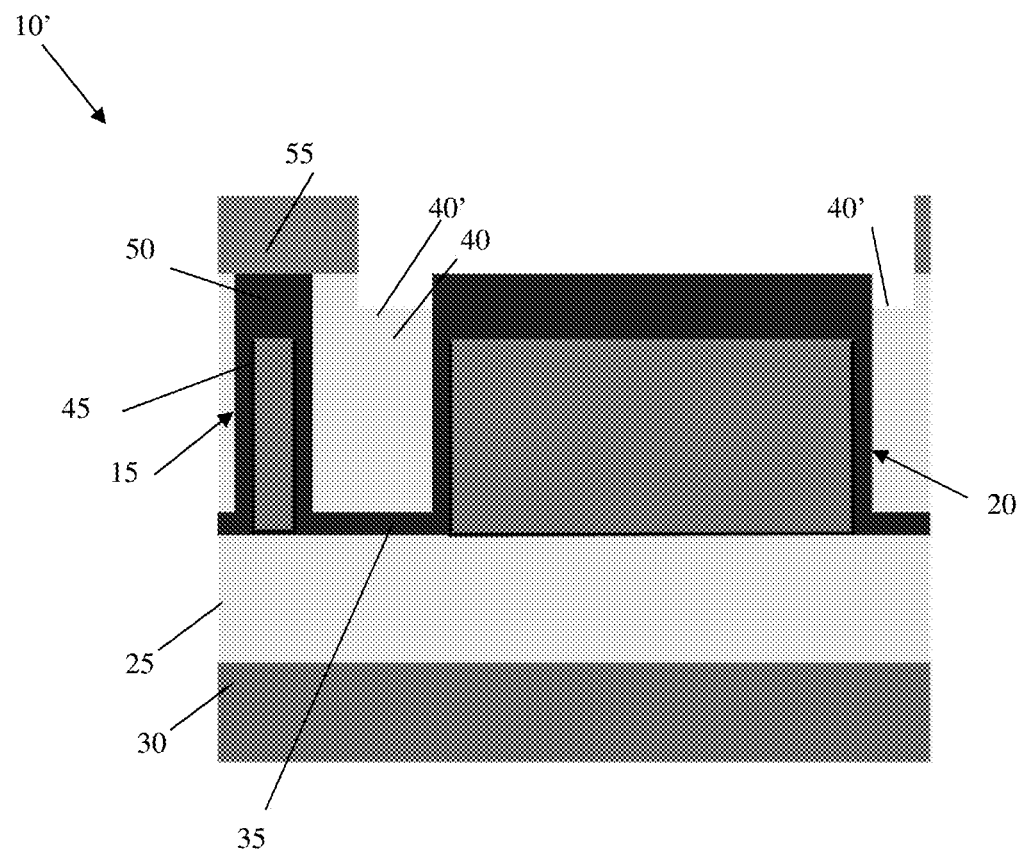
FIGS. 7-9 show structures and respective fabrication processes in accordance with additional aspects of the invention.
Figure 8:
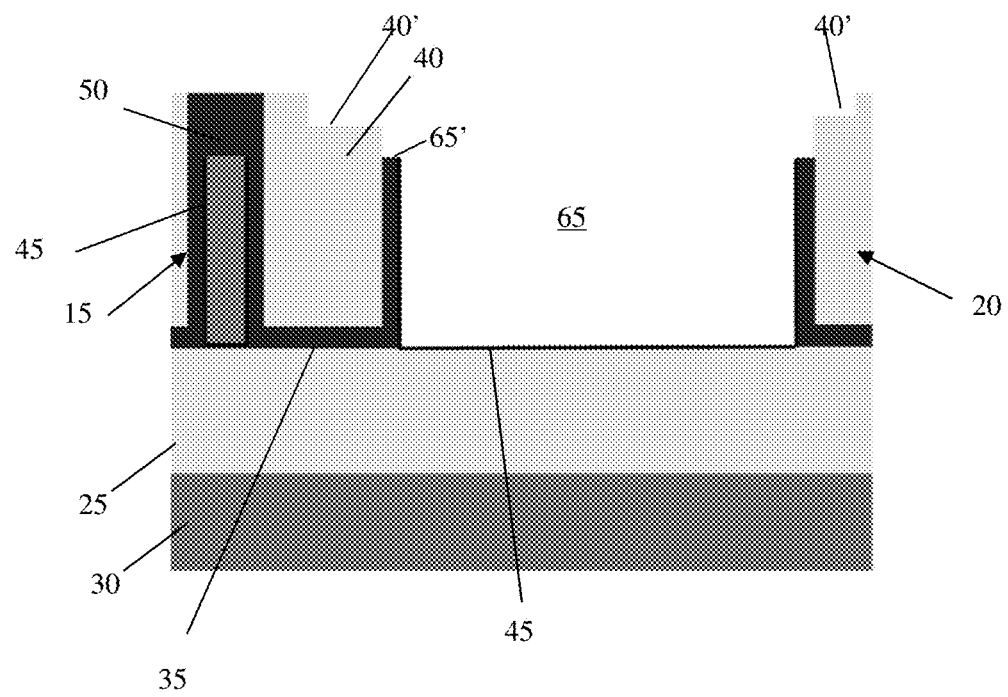
Figure 9:
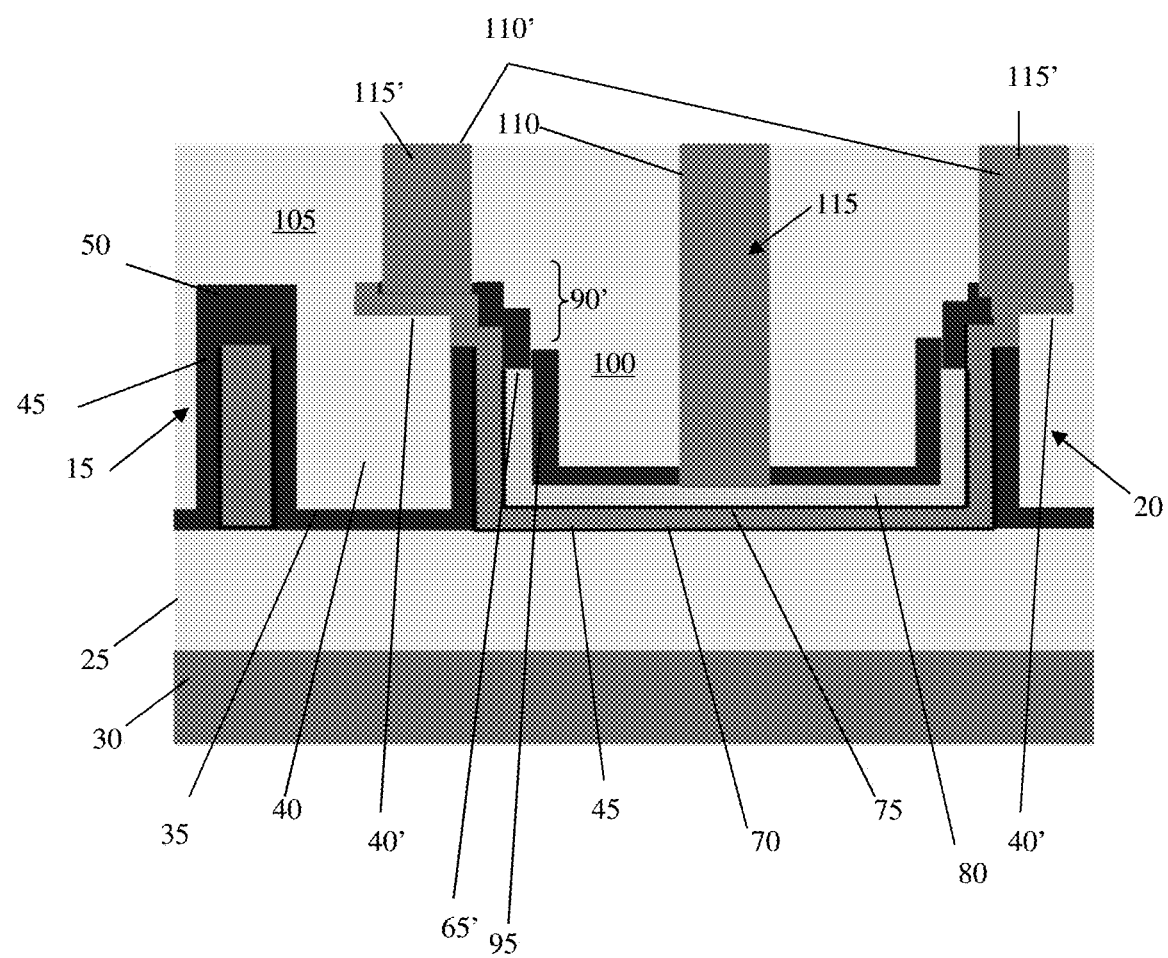

FIGS. 7-9 show structures and respective fabrication processes in accordance with additional aspects of the invention. In this embodiment, a ledge is formed on the insulator material 40 in order to increase contact area to the bottom electrode material. More specifically, similar to FIG. 1, the structure 10' includes a first gate structure 15 and a second gate structure 20, with the second gate structure 20 wider than the first gate structure 15. The gate structures 15, 20 can be formed on an insulator layer 25 using conventional replacement metal gate processes and materials as described herein (e.g., high-k dielectric material and gate stack material 45, and a capping material 50 (e.g., nitride)). The insulator layer 25 can be an oxide layer formed on the substrate 30. The substrate 30 may be composed of any suitable semiconductor material including, but not limited to, Si, SiGe, SiGeC, SiC, GE alloys, GaAs, InAs, InP, and other III/V or II/VI compound semiconductors. In embodiments, the substrate can be silicon-on-insulator (SOI) technology.

A capacitor mask 55 is formed over the gate structure 15. In embodiments, the capacitor mask 55 can be a resist or hardmask, which can extend slightly beyond an edge of the gate structure 15, onto the oxide or other insulator material 40. A selective etching step (e.g., RIE) is performed to remove portions of the oxide or other insulator material 40, adjacent to the gate structures 15, 20. This selective etching step forms a ledge or recessed surface area 40', which will increase the contact area for the bottom electrode material.

In FIG. 8, materials from the gate structure 20 are removed. In particular, the capping material 50 and gate stack material are removed to form a trench 65. In embodiments, the capping material 50 and materials of the gate stack 15 are protected during this selective etching process by the capacitor mask. In embodiments, portions of the nitride material 35 are also recessed within the trench 65, as shown by reference numeral 65'. The selective etching step will stop on the high-k dielectric material 45 of the gate structure 20. Once the etching process is completed, the capacitor mask can be removed by conventional stripping processes, e.g., ashing processes.

In FIG. 9, a bottom electrode material 70 is deposited on the high-k dielectric material 45, as well as on any exposed surfaces of the structure including the ledge 40'. This formation of the bottom electrode material 70 on the ledge 40' increases the surface area of the bottom electrode material for improved contact with contacts 115'. A high-k dielectric material 75 can be deposited on the bottom electrode material 70, using an atomic layer deposition (ALD) process; although other materials are also contemplated by the present invention as described herein. A top electrode material 80 is deposited on the high-k dielectric material 75. In embodiments, the bottom electrode material 70 and the top electrode material 80 can be tungsten silicide or TiN or other materials described herein, for example, deposited to a thickness of about 5-10 nm. The high-k dielectric material 75 can be deposited to a thickness of about a few nanometers; although other thicknesses are also contemplated by the present invention.

Still referring to FIG. 9, the bottom electrode material 70 is contacted at an edge or outside of the gate structure 20, with the top electrode material 80 contacted in a center of the gate structure 20. After a patterning process (e.g., removal of the top electrode material 80 at the ledge portion 40'), a cap material 95 is formed on the exposed portions of the top electrode material 80. An insulator material 100 is then deposited on the cap material 95. In embodiments, the cap material 95 can be a nitride material or a low-k dielectric material, deposited using conventional CVD or PEALD processes, to a same or similar thickness as the nitride or low-k dielectric material 35. The insulator material 100 can be an oxide material deposited using a conventional oxide fill process, e.g., CVD, HDP, flowable oxide or combinations thereof, followed by a planarization process.

As further shown in FIG. 9, an interlevel dielectric material 105 is deposited on the insulator material 100. Contact trenches 110, 110' are then formed in the insulator material 100, 105 and through other materials to land on and expose a surface of the top electrode material 80 and the bottom electrode material 70. In embodiments, the two outer contact trenches 110' will land on the ledge 40', thus exposing the planar surface of the bottom electrode material 70. The trenches are then filled with metal material, e.g., TiN liner with a tungsten fill, etc., followed by a planarization process (e.g., chemical mechanical polishing (CMP)) to form the contacts 115, 115' in direct electrical contact with the electrode materials 70, 80. As shown in this representation, the contacts 115' at the edge or outside of the gate structure 20 are formed on an increased surface area of the bottom electrode material 70 (due to the ledge 40') and hence have improved contact to the bottom electrode material 70.

Figure 10:
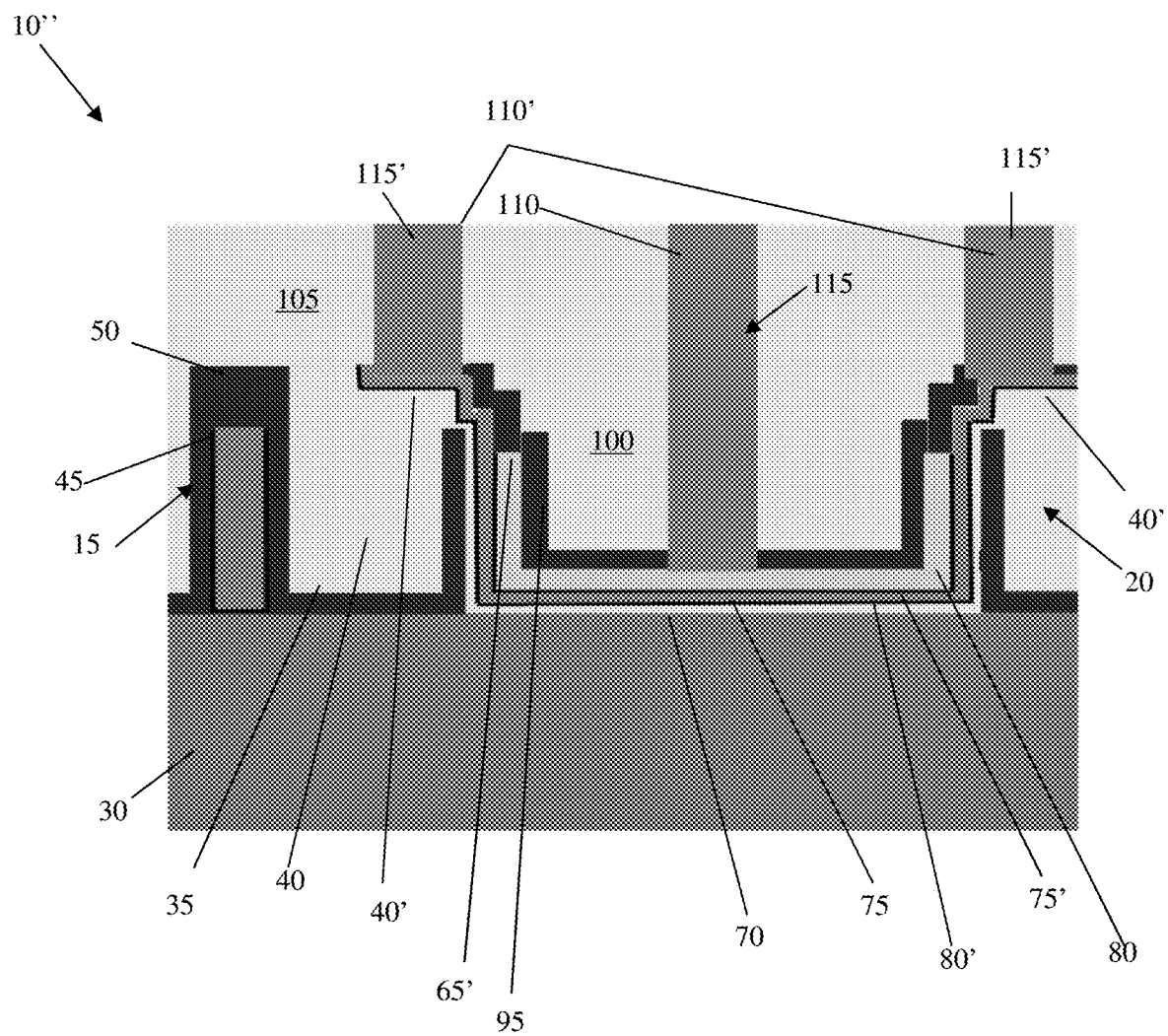
FIG. 10 shows a structure and respective fabrication processes in accordance with further aspects of the invention.

FIG. 10 shows a structure and respective fabrication processes in accordance with additional aspects of the invention. More specifically, the structure 10" of FIG. 10 can be a Metal-Insulator-Metal-Insulator-Metal (MIMIM) capacitor structure. Similar to FIG. 9, the structure 10" includes a first gate structure 15 and a second gate structure 20, with the second gate structure 20 wider than the first gate structure 15. In this embodiment, the gate structures 15, 20 are formed directly on substrate 30 in the manner already described herein. The substrate 30 may be composed of any suitable semiconductor material including, but not limited to, Si, SiGe, SiGeC, SiC, GE alloys, GaAs, InAs, InP, and other III/V or II/VI compound semiconductors. In embodiments, the substrate can be silicon-on-insulator (SOI) technology.

The gate structures 15, 20 include an encapsulating nitride or low-k dielectric material 35, with high-k dielectric material and gate stack material represented by reference numeral 45. A capping material 50 (e.g., nitride) is deposited over the recessed portion of the gate material. A ledge or recessed surface area 40' is formed by an etching process as described herein. In this embodiment, removal of the gate material of the gate structure 20 includes the capping material, gate stack material and the high-k dielectric material, in order to expose the underlying substrate 30. In embodiments, the capping material 50 and materials of the gate stack 15 are protected during this selective etching process by the capacitor mask.

In FIG. 10, a bottom electrode material 70 is deposited directly on the substrate 30 and the ledge 40'. By having the bottom electrode material 70 deposited directly on the substrate 30, the substrate 30 (which can be a fin in finFET technologies) can make an ohmic connection to the bottom electrode 70. A high-k dielectric material (or other material described herein) 75 can be deposited on the bottom electrode material 70, using ALD processes. A center electrode material 80' (e.g., conductive electrode plate) is deposited (and patterned) on the high-k dielectric material 75, extending onto the ledge 40'. As previously described, the placement of the electrode material, e.g., center electrode material 80', will increase the surface area for the contact 115'. A high-k dielectric material 75' is deposited on the center electrode material 80', followed by the deposition of a top electrode material 80. In embodiments, the electrode materials 75, 80' and 80 can be the same or different material, e.g., tungsten silicide or TiN or other materials as described herein, for example, deposited to a thickness of about 5-10 nm; although the use of other metals and metal alloys and dimensions are contemplated by the present invention. The high-k dielectric material 75, 75' can be deposited to a thickness of about a few nanometers; although other thicknesses are also contemplated by the present invention.

Still referring to FIG. 10, a cap material 95 is formed on the exposed portions of the top electrode material 80. In embodiments, the cap material 95 can be a nitride material or a low-k dielectric material, deposited using conventional CVD or PEALD processes, to a same or similar thickness as the nitride or low-k dielectric material 35. An insulator material 100 is then deposited on the cap material 95. The insulator material 100 can be an oxide material deposited using a conventional oxide fill process, e.g., CVD, HDP and flowable and combinations thereof, followed by a planarization process. An interlevel dielectric material 105 is deposited on the insulator material 100, with contact trenches 110, 110' formed in the insulator material 100, 105 and through other materials to land on the respective top electrode material 80 and the center electrode 80'. In embodiments, a contact trench can also be formed as source/drain contacts to the substrate 30, outside of the capacitor region to complete the MIMIM capacitor structure.

In embodiments, the two outer contact trenches 110' will land on the ledge 40', at the edge or outside of the gate structure 20 and the contact trench will be formed in the center of the gate structure. The contact trenches 110, 110' are then filled with metal material, e.g., TiN liner with a tungsten fill, etc., followed by a planarization process (e.g., chemical mechanical polishing (CMP)) to form the contacts 115, 115'. As shown in this representation, the contacts 115' formed at the edge or outside of the gate structure 20 contacts an increased surface area and hence exhibit improved contact formation to the center electrode material 80'.

Figure 11:
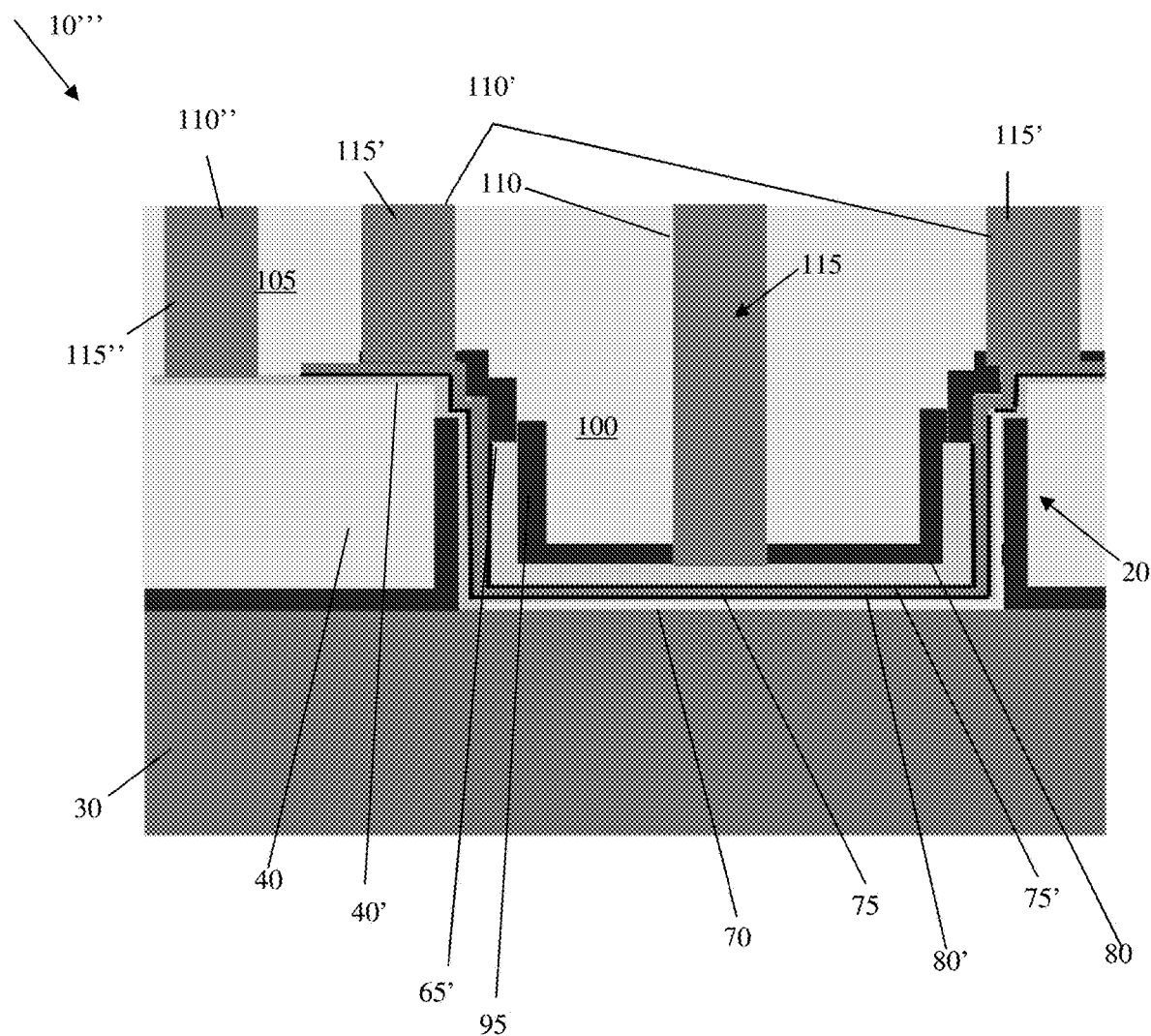
FIG. 11 shows a structure and respective fabrication processes in accordance with further aspects of the invention.

FIG. 11 shows a structure and respective fabrication processes in accordance with additional aspects of the invention. More specifically, the structure 10''' of FIG. 11 can be a MIMIM capacitor structure with an additional contact outside of the gate area contacting a lowermost electrode material. Similar to FIG. 10, the structure 10''' of FIG. 11 includes gate structures (with gate structure 20 shown), formed directly on the substrate 30 which may be composed of any suitable semiconductor material including, but not limited to, Si, SiGe, SiGeC, SiC, GE alloys, GaAs, InAs, InP, and other III/V or II/VI compound semiconductors. In embodiments, the substrate can be silicon-on-insulator (SOI) technology. An alternate option, substrate 30 is an insulator (similar to FIG. 1). In this option, the MIMIM would be formed on film 25 as shown in FIG. 1.

In this embodiment, a bottom electrode material 70 is deposited directly on the substrate 30 and the planar surface of the insulator layer 40. In alternative embodiments, the bottom electrode material 70 can also be formed on a ledge (e.g., ledge 40') formed in the manner already described. A high-k dielectric material (or other material described herein) 75 can be deposited on the bottom electrode material 70, using ALD processes. A center electrode material 80' is deposited on the high-k dielectric material 75, extending onto the planar surface of the insulator layer 40 (or ledge 40'). The high-k dielectric material 75 and the center electrode material 80' can be patterned to expose the bottom electrode material 70, at the edge or outside of the gate structure 20. A high-k dielectric material 75' is deposited on the center electrode material 80', followed by the deposition of a top electrode material 80. In embodiments, the electrode materials 70, 80' and 80 can be the same or different material, e.g., tungsten silicide or TiN or other materials described herein, deposited to a thickness of about 5-10 nm; although the use of other metals and metal alloys and dimensions are contemplated by the present invention. The high-k dielectric materials 75, 75' can be deposited to a thickness of about a few nanometers; although other thicknesses are also contemplated by the present invention.

A cap material 95 is formed on the top surface of the structure, which can be patterned to expose portions of the center electrode material 80 (and the bottom electrode material 70). An insulator material 100 is then deposited on the cap material 95 and any remaining exposed portions of the electrode material. In embodiments, the cap material 95 can be a nitride material or a low-k dielectric material, deposited using conventional CVD or PEALD processes, to a same or similar thickness as the nitride or low-k dielectric material 35. The insulator material 100 can be an oxide material deposited using a conventional oxide fill process, e.g., CVD, HDP, flowable oxide or combinations thereof, followed by a planarization process.

As further shown in FIG. 11, an interlevel dielectric material 105 is deposited on the insulator material 100. Contact trenches 110, 110', 110'' are then formed in the insulator material 100, 105 and through other materials to land on the top electrode material 80, the center electrode 80' and the bottom electrode material 70, respectively. In embodiments, the outer contact trenches 110', 110'' will land on the planar surface of the respective electrode materials 70, 80'. The trenches are then filled with metal material, e.g., TiN liner with a tungsten fill, etc., followed by a planarization process (e.g., chemical mechanical polishing (CMP)) to form the contacts 115, 115', 115'' in direct electrical contact with the electrode materials. As shown in this representation, the contacts 115', 115'' are formed at the edge or outside of the gate structure 20 and have an increased contact surface area.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a first gate structure having a first width dimension;
   forming a second gate structure having a second width dimension, larger than the first width dimension;
   removing material from the second gate structure to form a trench;
   forming a capacitor structure within the trench and partly outside of the trench;
   forming cap material of nitride material or a low-k dielectric material in the trench with a first stepped configuration including a plurality of steps at each edge of the trench; and
   forming an insulator material inside the trench formed on the cap material,
   wherein the forming the cap material includes forming a first step in the first stepped configuration at each of the edges of the trench on an electrode plate within the trench and forming a second step and a third step in the first stepped configuration at each of the edges of the trench on an electrode plate that extends outside of the trench,
   wherein the forming of the capacitor structure comprises:
   forming a first electrode plate on a dielectric material within the trench;
   forming a dielectric layer on the first electrode plate within the trench; and
   forming a second electrode plate on the dielectric layer within the trench,
   wherein the first electrode plate is the electrode plate that extends outside of the trench and the second electrode plate is the electrode plate within the trench;
   wherein the first electrode plate is a bottom plate formed at least partially on a ledge formed by recessing a second insulator material adjacent to the first gate structure and the second gate structure outside of the trench;

wherein the second electrode plate is a top plate formed entirely within the trench;

wherein a first contact contacts the first electrode plate and a second contact contacts the second electrode plate;

wherein the first electrode plate is formed on a semiconductor substrate on a bottom surface of the trench and extends to sidewalls of the trench and onto the ledge outside of the trench, wherein the cap material is in direct contact with the first electrode and the second electrode plate and extends over a second stepped configuration formed in the trench by the second electrode plate extending only partially within the trench to a height lower than the first electrode plate, wherein the first step, the second step, and the third step of the cap material are symmetrical at each of the edges of the trench.

2. The method of claim 1, wherein the forming of the capacitor structure further comprises forming the second contact in direct electrical contact with the second electrode plate within the trench.

3. The method of claim 1, wherein the forming of the capacitor structure further comprises forming the first contact in direct electrical contact with the first electrode plate outside of the trench.

4. The method of claim 1, wherein the second contact is in direct electrical contact with the second electrode plate and is formed in a contact trench.

5. The method of claim 4, wherein the contact trench is formed in the insulator material inside the trench.

6. A method comprising:
forming a first gate structure having a first width dimension;
forming a second gate structure having a second width dimension, larger than the first width dimension;
removing material from the second gate structure to form a trench;
forming a capacitor structure within the trench and partly outside of the trench;
forming cap material of nitride material or a low-k dielectric material in the trench with a first stepped configuration including a plurality of steps at each edge of the trench; and
forming an insulator material inside the trench formed on the cap material,
wherein the forming the cap material includes forming a first step in the first stepped configuration at each of the edges of the trench on an electrode plate within the trench and forming a second step and a third step in the first stepped configuration at each of the edges of the trench on an electrode plate that extends outside of the trench, wherein the forming of the capacitor structure comprises:
forming a first electrode plate within the trench;
forming a first dielectric layer on the first electrode plate;
forming a second electrode plate on the first dielectric layer;
forming a second dielectric layer on the second electrode plate; and
forming a third electrode plate on the second dielectric layer, wherein: the first electrode plate is a bottom electrode plate formed within the trench and extends outside the trench;
the second electrode plate is the electrode plate that extends outside of the trench and is a center electrode plate formed within the trench and at least partially on a ledge formed by recessing a second insulator material adjacent to the first gate structure and the second gate structure outside of the trench; and
the third electrode plate is the electrode plate within the trench and is an upper electrode plate formed entirely within the trench;

wherein a first contact contacts the first electrode plate, a second contact contacts the second electrode plate, and a third contact contacts the third electrode plate;

wherein the second electrode plate is formed on a semiconductor substrate on a bottom surface of the trench and extends to sidewalls of the trench and onto the ledge outside of the trench, wherein the cap material is in direct contact with the second electrode and the third electrode plate and extends over a second stepped configuration formed in the trench by the third electrode plate extending only partially within the trench to a height lower than the second electrode plate, wherein the first step, the second step, and the third step of the cap material are symmetrical at each of the edges of the trench.

7. The method of claim 6, wherein the third contact is formed in direct electrical contact with the upper electrode plate within the trench.

8. The method of claim 6, wherein the second contact is formed in direct electrical contact with the center electrode plate outside of the trench.

9. The method of claim 6, wherein the first contact is formed in direct electrical contact with the bottom electrode plate outside of the trench.

10. The method of claim 6, wherein the second electrode plate is formed by a deposition and patterning processes.

11. The method of claim 6, wherein the first dielectric layer is a high-k dielectric material, and the second dielectric layer is a high-k dielectric material.

12. The method of claim 6, wherein the first electrode plate is formed within the trench and extends onto the ledge outside of the trench.

* * * * *